(12) United States Patent
Zhao et al.

(10) Patent No.: US 10,993,316 B2
(45) Date of Patent: Apr. 27, 2021

(54) PROTECTIVE FILM OF CONDUCTIVE ADHESIVE, CIRCUIT BOARD, AND METHOD FOR ASSEMBLING DISPLAY DEVICE

(71) Applicants: BOE (HEBEI) MOBILE DISPLAY TECHNOLOGY CO., LTD., Hebei (CN); BOE TECHNOLOGY GROUP CO., LTD., Beijing (CN)

(72) Inventors: Lei Zhao, Beijing (CN); Linsong Wang, Beijing (CN); Ertao Yin, Beijing (CN); Zhiyang Cui, Beijing (CN); Dahua Zhu, Beijing (CN)

(73) Assignees: BOE (HEBEI) MOBILE DISPLAY TECHNOLOGY CO., LTD., Hebei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/454,170

(22) Filed: Jun. 27, 2019

(65) Prior Publication Data
US 2020/0084883 A1   Mar. 12, 2020

(30) Foreign Application Priority Data

Sep. 6, 2018   (CN) .......................... 201811036484.X

(51) Int. Cl.
*H05K 1/02*   (2006.01)
*H05K 1/18*   (2006.01)
(Continued)

(52) U.S. Cl.
CPC ........... *H05K 1/0259* (2013.01); *H05K 1/189* (2013.01); *H05K 3/027* (2013.01); *H05K 3/321* (2013.01);
(Continued)

(58) Field of Classification Search
CPC ........ H05K 3/305; H05K 3/321; H05K 3/323; H05K 2201/09109; H05K 1/0259
See application file for complete search history.

(56) References Cited

U.S. PATENT DOCUMENTS 5,338,490 A * 8/1994 Dietz ................. A61B 5/04087
                                                            252/500
6,214,900 B1 * 4/2001 Takada ...................... C09J 4/00
                                                            522/96
(Continued)

FOREIGN PATENT DOCUMENTS

| CN | 103253869 A  | 8/2013  |
| CN | 207347449 U  | 5/2018  |
| JP | S59231887 A  | 12/1984 |

OTHER PUBLICATIONS

First Office Action for Chinese Application No. 201811036484.X, dated Nov. 28, 2019, 5 Pages.

*Primary Examiner* — Steven T Sawyer
*Assistant Examiner* — Paresh H Paghadal
(74) *Attorney, Agent, or Firm* — Brooks Kushman P.C.

(57) ABSTRACT

A protective film of a conductive adhesive, a circuit board and a method for assembling a display device are provided. The protective film of conductive adhesive includes: a basic material layer; and a photoinduced peelable adhesive and a protective layer which are arranged on a first surface of the basic material layer in sequence, and the photoinduced peelable adhesive has a low adhesive force in the exposure of light with a first wavelength. The protective film further includes a light-shielding film located on a second surface of the basic material layer opposite to the first surface.

8 Claims, 4 Drawing Sheets

(51) Int. Cl.
  *H05K 3/02* (2006.01)
  *H05K 3/32* (2006.01)
(52) U.S. Cl.
  CPC .............. *H05K 2201/09109* (2013.01); *H05K 2201/09127* (2013.01); *H05K 2201/10128* (2013.01)

(56) References Cited

U.S. PATENT DOCUMENTS

2015/0264806 A1\* 9/2015 Happoya .............. H05K 1/0298
              174/251
2019/0013487 A1\* 1/2019 Park .................... H01L 51/5284

\* cited by examiner

PROTECTIVE FILM OF CONDUCTIVE ADHESIVE, CIRCUIT BOARD, AND METHOD FOR ASSEMBLING DISPLAY DEVICE

CROSS-REFERENCE TO RELATED APPLICATION

This application claims priority to Chinese Patent Application No. 201811036484.X filed on Sep. 6, 2018, which is incorporated herein by reference in its entirety.

TECHNICAL FIELD

The present disclosure relates to the field of display technologies, in particular to a protective film of a conductive adhesive, a circuit board and a method for assembling a display device.

BACKGROUND

A flexible printed circuit board (FPC) has been widely found in various fields, such as electronic products. The flexible printed circuit board tends to accumulate static charges which may adversely affect an overall performance of an electronic product, for example its signal property of a display module. In order to reduce static charges, a copper exposure area is left on the flexible printed circuit board. The copper exposure area is in contact with a metal structure of the electronic product to conducting out static charges rapidly.

SUMMARY

In a first aspect, a protective film of a conductive adhesive is provided according to embodiments of the present disclosure. The protective film includes:

a basic material layer;

a photoinduced peelable adhesive and a protective layer that are arranged on a first surface of the basic material layer in sequence, where the photoinduced peelable adhesive has a low adhesive force in the exposure of light with a first wavelength; and a light-shielding film located on a second surface of the basic material layer opposite to the first surface.

In some optional embodiments, the protective layer is made of an opaque material, and the photoinduced peelable adhesive is ultraviolet curable, and the protective layer and the light-shielding film are both configured to shield ultraviolet light.

In some optional embodiments, the protective film further includes a first adhesive arranged between the basic material layer and the photoinduced peelable adhesive, and the basic material layer is made of polyethylene terephthalate (PET) plastic.

In some optional embodiments, an orthographic projection of the photoinduced peelable adhesive onto the basic material layer is within an orthographic projection of the light-shielding film onto the basic material layer.

In some optional embodiments, an adhesiveness of the photoinduced peelable adhesive is larger than an adhesiveness of the light-shielding film.

In some optional embodiments, at least one side of the light-shielding film is provided with a first handle, and at least one side of the basic material layer is provided with a second handle.

In a second aspect, a circuit board is provided according to embodiments of the present disclosure. The circuit board includes a substrate, and a conductive pattern, a conductive adhesive and a protective film that are arranged on the substrate in sequence, where the conductive pattern is configured to release static charges. The protective film includes a basic material layer, and a photoinduced peelable adhesive arranged on a first surface of the basic material layer, where the photoinduced peelable adhesive is located between the basic material layer and the substrate, and has a low adhesive force in the exposure of light with a first wavelength. The photoinduced peelable adhesive is arranged in a peripheral area of the conductive adhesive.

In some optional embodiments, an orthographic projection of the conductive adhesive onto the substrate is not overlapped with an orthographic projection of the photoinduced peelable adhesive onto the substrate, and the orthographic projection of the photoinduced peelable adhesive onto the substrate and the orthographic projection of the conductive adhesive onto the substrate are within an orthographic projection of the basic material layer onto the substrate.

In some optional embodiments, the photoinduced peelable adhesive includes a plurality of adhesive sub-patterns that is distributed at intervals and surrounds the conductive adhesive.

In some optional embodiments, an orthographic projection of the conductive adhesive onto the substrate is located within an orthographic projection of the photoinduced peelable adhesive onto the substrate.

In some optional embodiments, the circuit board further includes a first adhesive arranged between the basic material layer and the photoinduced peelable adhesive.

In some optional embodiments, the circuit board further includes a light-shielding film arranged on a second surface of the basic material layer facing away from the substrate, where an orthographic projection of the photoinduced peelable adhesive onto the substrate is located within an orthographic projection of the light-shielding film onto the substrate.

In some optional embodiments, an adhesiveness of the photoinduced peelable adhesive is larger than an adhesiveness of the light-shielding film.

In some optional embodiments, at least one side of the light-shielding film is provided with a first handle.

In some optional embodiments, at least one side of the basic material layer is provided with a second handle.

In some optional embodiments, the conductive pattern is made of copper.

In a third aspect, a method for assembling a display device is provided according to embodiments of the present disclosure. The display device includes an electrostatic discharge structure and the circuit board described in the second aspect, and the assembling method includes:

irradiating the photoinduced peelable adhesive on the circuit board using the light with the first wavelength to reduce an adhesiveness of the photoinduced peelable adhesive;

removing the protective film; and adhering the electrostatic discharge structure to the conductive pattern of the circuit board by the conductive adhesive, such that the electrostatic discharge structure is electrically connected with the conductive pattern of the circuit board, to release the static charges on the circuit board by the electrostatic discharge structure.

In some optional embodiments, a light-shielding film is arranged on a surface of the basic material layer facing away from the substrate; and before irradiating the photoinduced peelable adhesive using ultraviolet light, the method includes: removing the light-shielding film.

In some optional embodiments, the electrostatic discharge structure is a metal element of the display device that is grounded, the photoinduced peelable adhesive is ultraviolet curable, the protective layer and the light-shielding film are both configured to shield ultraviolet light, and the irradiating the photoinduced peelable adhesive on the circuit board using the light with the first wavelength includes: irradiating the photoinduced peelable adhesive on the circuit board using the ultraviolet light.

BRIEF DESCRIPTION OF THE DRAWINGS

In order to more clearly explain the technical solutions of the embodiments of the present disclosure or in a related art, the drawings to be used in the descriptions of the embodiments or in the related art are briefly introduced as follows. Apparently, the following drawings merely illustrate some embodiments of the present disclosure, and a person skilled in the art can obtain other drawings from these drawings without creative effort.

DETAILED DESCRIPTION

Figure 1:
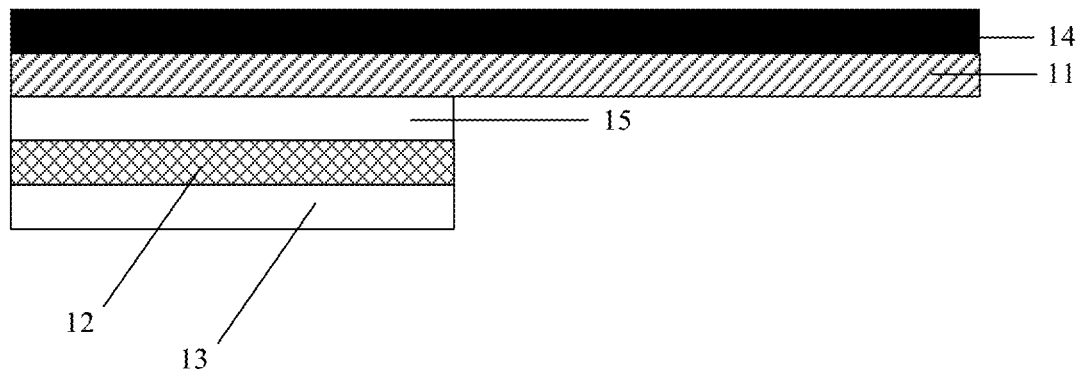
FIG. 1 shows a structural schematic diagram of a protective film according to some embodiments of the present disclosure.

The present disclosure will be below further described in combination with drawings and specific embodiments. The following embodiments are merely used for explaining the present disclosure, but not to limit the scope thereof.

In order to conduct out static charges of electronic products rapidly, a copper exposure area is arranged on the flexible printed circuit board in contact with the metal structure of the electronic product. In order to realize their stable contact, conductive adhesive needs to be used. Usually, the electronic product has a complicated internal structure, with a difficulty of disposing the conductive adhesive, so it is necessary to arrange the conductive adhesive onto the copper exposure area of the flexible printed circuit board of a display module. For the display module, it needs to avoid not only the static charges, but also radio frequency interference. Therefore, an electromagnetic interference (EMI) coating is applied on a large area of the FPC, thereby leading to a small copper exposure area on the FPC, and relatively small areas of the conductive adhesive and the protective film of the conductive adhesive on the copper exposure area.

Additionally, during the process of assembling the flexible printed circuit board and the electronic product, it needs to tear off the protective film of the conductive adhesive, and the conductive adhesive realizes a tight adhesion between the copper exposure area of the flexible printed circuit board and the metal structure of the electronic product, which requires that a release force between the conductive adhesive and the protective film to be smaller than an adhesive force between the conductive adhesive and the copper exposure area of the FPC. In order to meet this condition, the adhesiveness between the conductive adhesive and the protective film would not be too large. Due to the bendable FPC and a small adhesive area between the conductive adhesive and the protective film, in case of the bent conductive adhesive, the adhesive force between the conductive adhesive and the protective film is less than a rebound stress of the protective film, which causes the protective film to fall off. During the module production, with complicated procedures and man-made operations, due to bumpy transportation, the proportion of the protective film falling off is greatly increased. Before the electronic product is assembled, the conductive film has been polluted seriously, without adhesiveness and conductive property.

In order to solve the above-mentioned technical problem, the present disclosure provides a protective film of a conductive adhesive and a circuit board according to embodiments. The protective film includes: a basic material layer; and photoinduced peelable adhesive and a protective layer which are arranged on a first surface of the basic material layer, and the photoinduced peelable adhesive has a low adhesive force in the exposure of light with a first wavelength. The protective film further includes a light-shielding film located on a second surface of the basic material layer opposite to the first surface.

Usually, the photoinduced peelable adhesive is ultraviolet (UV) curable, and after the photoinduced peelable adhesive is irradiated by the UV light, its adhesiveness lowers or even loses, with applications in industries of instruments and apparatus, electronics and automobile. In the related art, the photoinduced peelable adhesive may be prepared by a plurality of methods. For example, an acrylic copolymer solution (and basic adhesive) with a reactive radical group is synthesized by solution polymerization, a multifunctional photosensitive resin is added into the basic adhesive, and the photoinduced peelable adhesive is obtained by mixing the basic adhesive with the multifunctional photosensitive resin. Alternatively, by the mixture of a thermoplastic elastomer and a tackifying resin, the multifunctional photosensitive resin is added into the basic adhesive, and the photoinduced peelable adhesive is obtained by mixing the basic adhesive with the multifunctional photosensitive resin.

The circuit board includes a substrate, and a conductive pattern, a conductive adhesive and a protective film which are arranged on the substrate in sequence, and the conductive pattern for releasing static charges. The protective film includes a basic material layer, and photoinduced peelable adhesive arranged on a first surface of the basic material layer, the photoinduced peelable adhesive is located between the basic material layer and the substrate, and the photoinduced peelable adhesive has a low adhesive force in the exposure of light with the first wavelength. The photoinduced peelable adhesive is arranged in a peripheral area of the conductive adhesive.

In the above-mentioned technical solutions, the adhesive area between the protective film and the circuit board is increased by arranging photoinduced peelable adhesive on the protective film, thereby increasing the adhesive force between the protective film and the circuit board. The peripheral area of the conductive adhesive has the photoinduced peelable adhesive, which may prevent the protective film from falling off from the conductive adhesive, and thereby protecting the conductive adhesive from being polluted, guaranteeing the static charges to be discharged and improving the product quality. Meanwhile, in the case of assembly of the display device, by irradiating the photoinduced peelable adhesive using the light with a specific wavelength, the adhesiveness of the photoinduced peelable adhesive is reduced or even lost, a tearing-off force of the protective film is reduced, and the conductive adhesive is prevented from being torn off when the protective film is torn off. Therefore, even the adhesiveness between the circuit board and the conductive adhesive is relatively small, the conductive adhesive does not tend to fall off when the protective film is torn off.

The present disclosure will be below further described in detail in combination with drawings and embodiments. The following embodiments are merely used for explaining the present disclosure, but not to limit the scope thereof.

Figure 2:
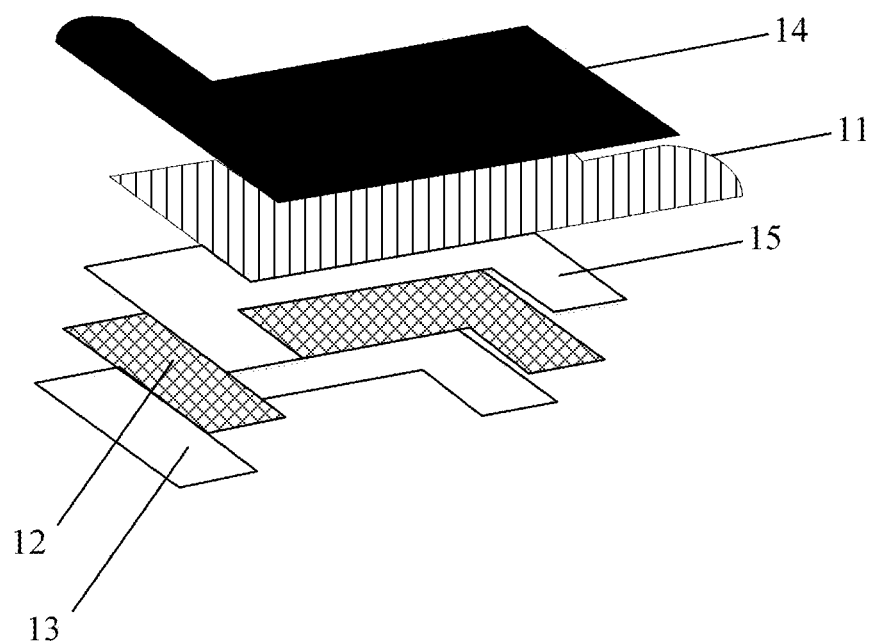
FIG. 2 shows an exploded structural diagram of a protective film according to some embodiments of the present disclosure.

With reference of FIGS. 1 and 2, the embodiments of the present disclosure provide a protective film of a conductive adhesive, including a basic material layer 11, and photoinduced peelable adhesive 12 and a protective layer 13 laminated on the basic material 11 in sequence, the protective layer 13 is made of an opaque material, and the photoinduced peelable adhesive 12 has a low adhesive force in the exposure of the light with a specific wavelength.

With the photoinduced peelable adhesive, the above-mentioned protective film is attached onto the circuit board by the conductive adhesive and the photoinduced peelable adhesive, which increases the adhesive area between the protective film and the circuit board, thereby increasing the adhesive force between the protective film and the circuit board, preventing the protective film from falling off from the conductive adhesive, and protecting the conductive adhesive from being polluted. Meanwhile, in the case of assembly of the display device, by irradiating the photoinduced peelable adhesive using the light with a specific wavelength, the adhesiveness of the photoinduced peelable adhesive lowers or even loses, a tearing-off force between the protective film and the conductive adhesive is reduced, and the conductive adhesive is prevented from being torn off when the protective film is torn off. Therefore, even the adhesiveness between the circuit board and the conductive adhesive is relatively small, the conductive adhesive does not tend to fall off when the protective film is torn off.

In some optional embodiments, the adhesiveness of the photoinduced peelable adhesive 12 is larger than that of the conductive adhesive 3. With respect to the adhesiveness of the photoinduced peelable adhesive 12, the higher is the better, which greatly increases the adhesive force between the protective film and the circuit board, and ensures that the protective film would not fall off. When the protective film is torn off, its adhesiveness is greatly reduced, or even lost, and the conductive adhesive thereunder is not torn off.

A light-shielding film 14 is arranged on a second surface of the basic material layer 11 opposite to the first surface. The protective layer 13 and the light-shielding film 14 are used for protecting the photoinduced peelable adhesive 12 from being irradiated by the light with a specific wavelength, which prevents the photoinduced peelable adhesive from being irradiated by the light with a specific wavelength to reduce or even lose its adhesiveness before the display device is assembled.

In some optional embodiments, the photoinduced peelable adhesive 12 may be UV curable, and the light with the specific wavelength is UV light.

When the light-shielding film 14 is removed, the photoinduced peelable adhesive 12 still has adhesiveness. In order to avoid a damage to the adhesive area between the photoinduced peelable adhesive 12 and the circuit board when the light-shielding film 14 is removed, the adhesiveness of the photoinduced peelable adhesive 12 is set to be larger than that of the light-shielding film 14.

Certainly, the light-shielding film may be omitted if no UV light is guaranteed in the case of production, and the protective layer may be made of a non-opaque material.

In order to further increase the adhesive force between the protective film and the circuit board, a first adhesive 15 may be further arranged between the basic material layer 11 and the photoinduced peelable adhesive 12. When the display device is assembled, the photoinduced peelable adhesive 12 is irradiated using UV light, which causes the adhesiveness of the photoinduced peelable adhesive 12 to be reduced or even lost. The first adhesive 15 falls off from the circuit board. Therefore, the first adhesive 15 does not increase the tearing-off force of the protective film, and the conductive adhesive is prevented from being torn off when the protective film is torn off.

The protective film according to the embodiments of the present disclosure is used as follows. After the conductive adhesive is formed on the circuit board, the protective layer 13 is torn off, such that the photoinduced peelable adhesive 12 is exposed, and the basic material layer of the protective film is adhered onto the conductive adhesive on the circuit board by the exposed photoinduced peelable adhesive 12. When the display device is assembled, the light-shielding film 14 is torn off. The photoinduced peelable adhesive is irradiated using the light with the first wavelength, which reduces or even loses the adhesiveness of the photoinduced peelable adhesive 12. The protective film including the photoinduced peelable adhesive 12 and the basic material layer 11 are torn off with a small force, and an anti-static structure of the display device is adhered onto the conductive adhesive on the circuit board.

Figure 3:
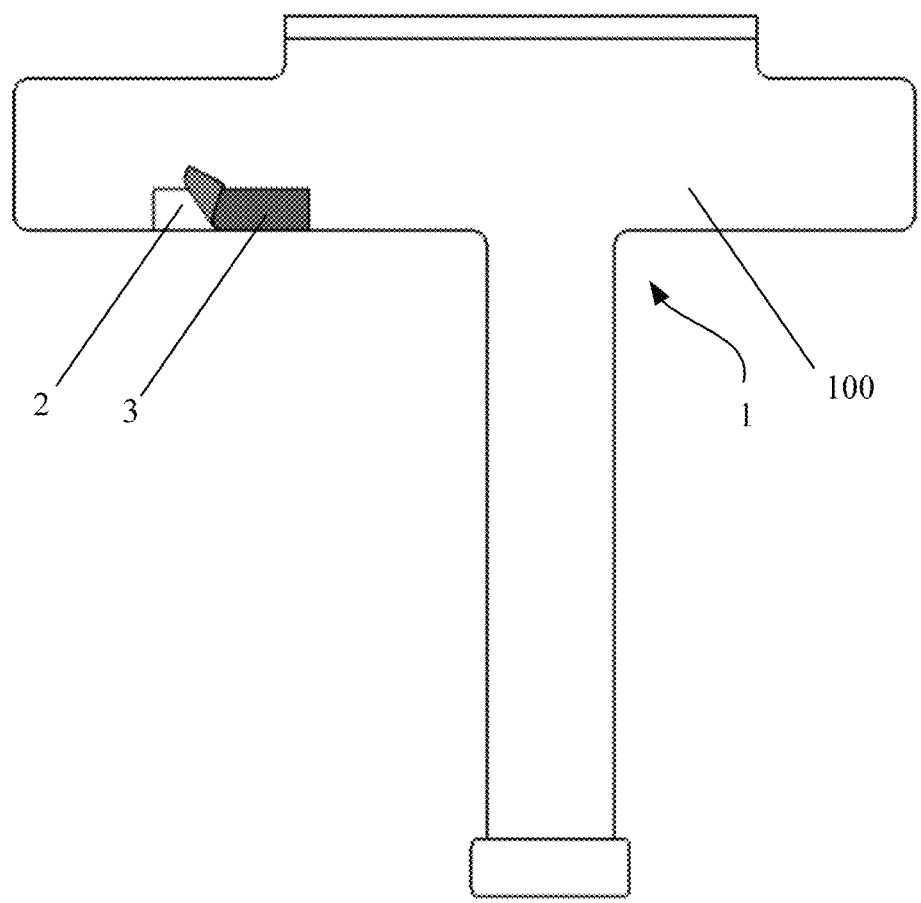
FIG. 3 shows a structural schematic diagram of a circuit board according to some embodiments of the present disclosure.

Based on the same inventive conception, as shown in FIG. 3, some embodiments of the present disclosure further provide a circuit board 1, including a substrate 100 and a conductive pattern 2 arranged on the substrate 100, and the conductive pattern 2 is configured to release static charges. The conductive pattern 2 may be made of Cu. The conductive adhesive 3 is arranged on a surface of the conductive pattern 2 facing away from the substrate 100.

Figure 4:
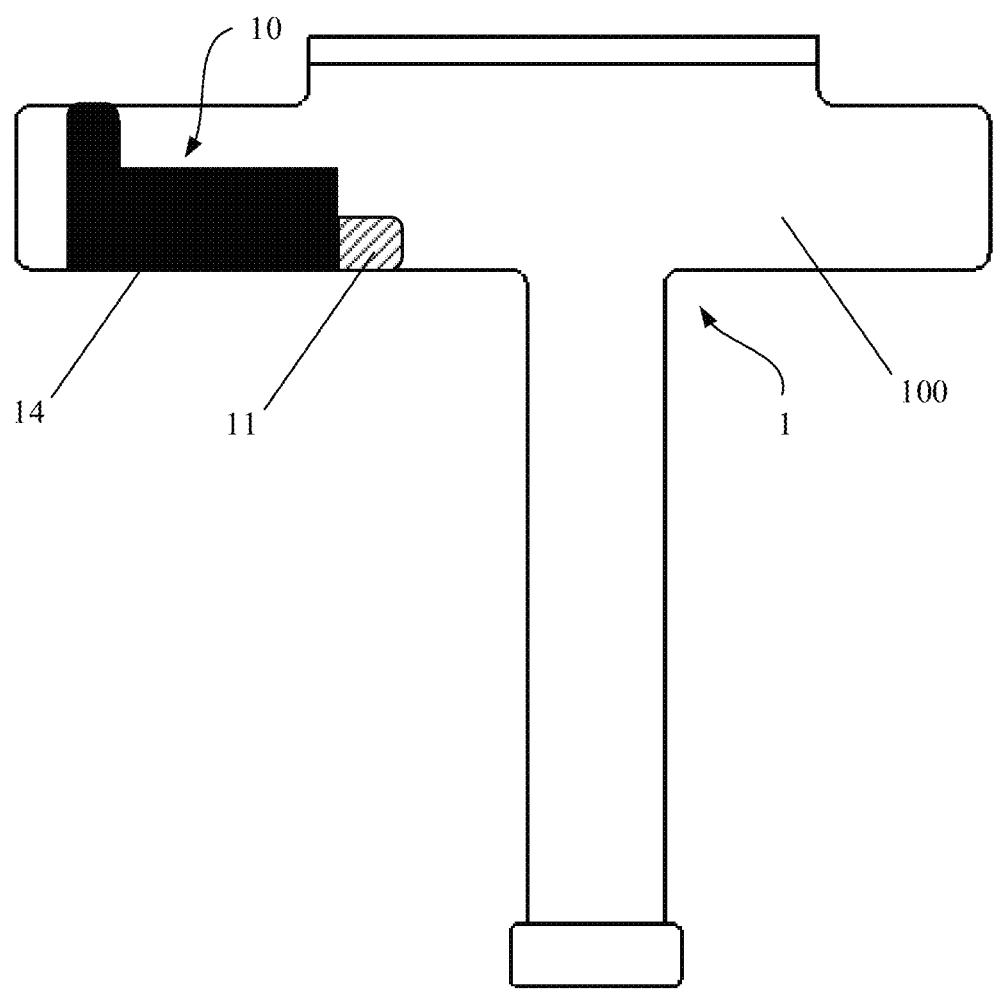
FIG. 4 shows an assembly schematic diagram of the circuit board and the protective film according to some embodiments of the present disclosure.

As shown in FIG. 4, the circuit board 1 further includes a protective film 10 covering the conductive adhesive 3. The protective film 10 includes a basic material layer 11 and a photoinduced peelable adhesive 12 arranged on a first surface of the basic material layer 11, and the photoinduced peelable adhesive 12 is located between the basic material layer 11 and the substrate 100.

The peripheral area of the conductive adhesive 3 has the photoinduced peelable adhesive 12, and the orthographic projection of the conductive adhesive 3 on the substrate 100 and the orthographic projection of the photoinduced peelable adhesive 12 on the substrate 100 are both located within the orthographic projection of the basic material layer 11 on the substrate 100.

In the above-mentioned technical solutions, the protective film 10 is adhered onto the circuit board 1 by the conductive adhesive and the photoinduced peelable adhesive, which increases the adhesive area between the protective film 10 and the circuit board 1, thereby increasing the adhesive force between the protective film 10 and the circuit board 1. The peripheral area of the conductive adhesive has the photoinduced peelable adhesive. A peeling force formed at the periphery of the conductive adhesive due to the bent flexible printed circuit board 1 or the bumpy transportation is greater than a peeling force formed in the area where the conductive adhesive is located, thereby preventing the protective film 10 from falling off from the conductive adhesive, and protecting the conductive adhesive from being polluted. Meanwhile, in the case of assembly of the display device, by irradiating the photoinduced peelable adhesive using the UV light, the adhesiveness of the photoinduced peelable adhesive lowers, or even loses, a tearing-off force of the protective film 10 is reduced, and the conductive adhesive is prevented from being torn off when the protective film 10 is torn off. Therefore, even the adhesiveness between the circuit board and the conductive adhesive is relatively small, the conductive adhesive does not tend to fall off when the protective film is torn off.

In the present embodiment, the adhesiveness of the photoinduced peelable adhesive 12 may be set to be larger than that of the conductive adhesive 3. With respect to the adhesiveness of the photoinduced peelable adhesive 12, the higher is the better, which ensures that the protective film 10 would not fall off. When the protective film 10 is torn off after the light of the specific wavelength is irradiated, its adhesiveness is greatly reduced or even lost, and the conductive adhesive is not torn off.

In order to further increase the adhesive force between the protective film 10 and the circuit board 1, the first adhesive 15 may be further arranged between the basic material layer 11 and the photoinduced peelable adhesive 12. In the case of assembly of the display device, by irradiating the photoinduced peelable adhesive 12 using the UV light, the adhesiveness of the photoinduced peelable adhesive 12 is reduced or even lost, and the first adhesive falls off from the circuit board 1. Therefore, the first adhesive 15 would not increase the tearing-off force of the protective film 10, and the conductive adhesive is prevented from falling off when the protective film 10 is torn off.

By arranging the photoinduced peelable adhesive on the protective film of the conductive adhesive and at least at the periphery of the conductive adhesive, the circuit board according to the present disclosure ensures that the protective film on the conductive adhesive does not fall off, achieving the purpose of the present disclosure. The way of arranging the photoinduced peelable adhesive will be explained in several embodiments.

Figure 5:
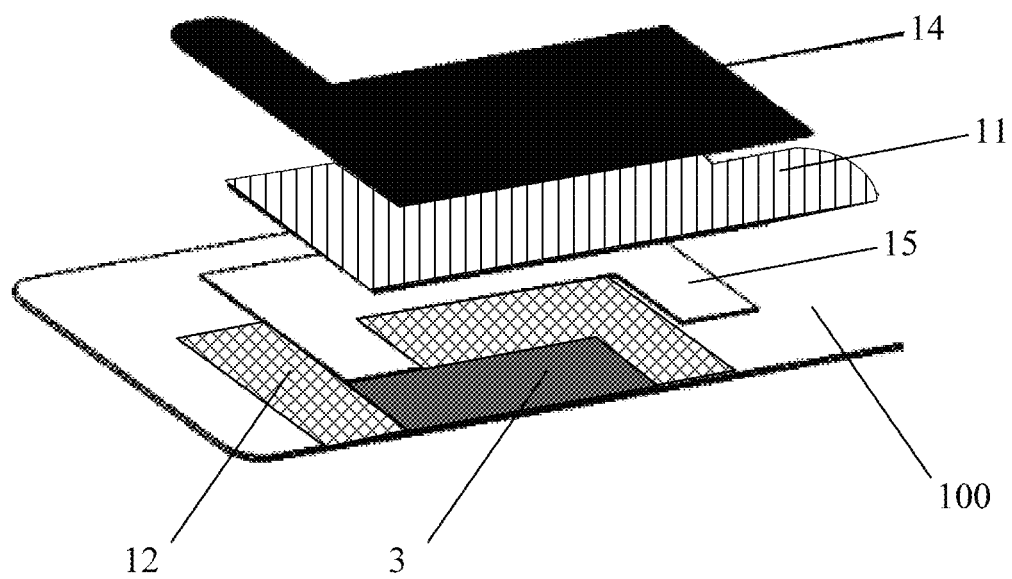
FIG. 5 is a local exploded structural diagram of FIG. 4.
Figure 6:
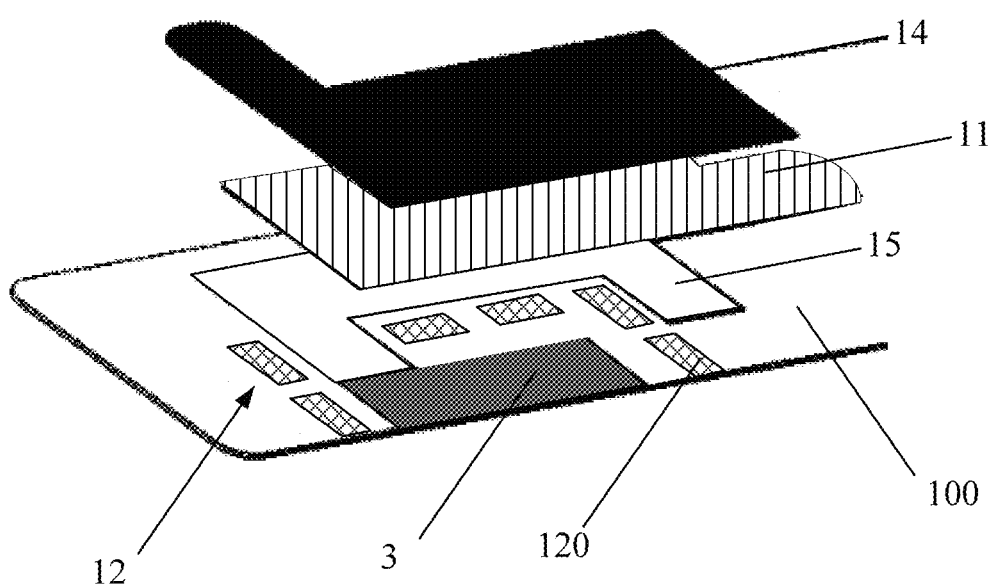
FIG. 6 shows an assembly schematic diagram of the circuit board and the protective film according to some embodiments of the present disclosure.

In some optional embodiments, with reference to FIGS. 5 and 6, the peripheral area of the conductive adhesive 3 is provided with the photoinduced peelable adhesive 12, the orthographic projection of the photoinduced peelable adhesive 12 on the substrate 100 is not overlapped with that of the conductive adhesive 3 on the substrate 100, and the photoinduced peelable adhesive 12 has a relatively small area, which reduces the influence on the circuit board.

In some optional embodiments, the photoinduced peelable adhesive 12 may be set to be annular around the conductive adhesive 3. The photoinduced peelable adhesive 12 is in a direct contact with the conductive adhesive 3, which prevents the conductive adhesive 3 from being influenced by moisture at a side surface before use, and avoids a reduction in adhesiveness. It can be ensured that the protective film is adhered onto the conductive adhesive always, and the conductive adhesive is not polluted. With a limitation to the shape of an outer contour of the photoinduced peelable adhesive 12 facing away from the conductive adhesive 3, it may be rectangular, square, circular and oval, or of an irregular shape.

In some optional embodiments, as shown in FIG. 6, the photoinduced peelable adhesive 12 may include a plurality of adhesive sub-patterns 120 distributed at intervals and surrounding the conductive adhesive 3. As shown in FIG. 6, the plurality of adhesive sub-patterns 120 forms one circle or many circles around the conductive adhesive 3, and one circle of adhesive sub-patterns 120 may be differently or identically arranged from or with other circles of adhesive sub-patterns 120.

As shown in FIG. 5, the rectangular conductive adhesive 3 is located at one edge of the substrate 100, one side of the conductive adhesive 3 aligns with one edge of the substrate 100, and the photoinduced peelable adhesive 12 is U shaped, surrounding three surfaces of the conductive adhesive 3. It is understood that the conductive adhesive may be further arranged at other positions of the substrate. For example, two sides of the conductive adhesive align with the edges of the substrate 100, the photoinduced peelable adhesive 12 has an L-shaped structure, and it surrounds two sides of the conductive adhesive 3 which do not align with the edge of the substrate 100. In the present disclosure, the position of the conductive adhesive is not limited, as long as the side of the conductive adhesive which does not align with the edge of the substrate 100 is surrounded by the photoinduced peelable adhesive 12.

In some optional embodiments, the conductive adhesive 3 may be arranged away from all edges of the substrate 100, and the photoinduced peelable adhesive 12 may have an enclosed annular structure, surrounding the periphery of the conductive adhesive 3, so as to protect the conductive adhesive 3 from being influenced by external air or moisture, thereby ensuring that the conductive adhesive 3 has good conductivity and adhesiveness.

In the above-mentioned embodiments, the photoinduced peelable adhesive is arranged at a peripheral area of the conductive adhesive. Certainly, the orthographic projection of the conductive adhesive on the substrate may be set to be located in the orthographic projection of the photoinduced peelable adhesive on the substrate, i.e., the photoinduced peelable adhesive covers the conductive adhesive. In the case of assembly of the display device, by irradiating the photoinduced peelable adhesive using the UV light, its adhesiveness is reduced or even lost. Therefore, even if the photoinduced peelable adhesive covers the conductive adhesive, the conductive adhesive is not torn off when the protective film is torn off.

In the above-mentioned present embodiments, the adhesiveness of the photoinduced peelable adhesive 12 may be set to be larger than that of the conductive adhesive 3. With respect to the adhesiveness of the photoinduced peelable adhesive 12, the higher the better, which ensures that the protective film 10 does not fall off. When the protective film 10 is torn off after the light of the specific wavelength is irradiated, its adhesiveness greatly reduced or even lost, and the conductive adhesive is not torn off.

Certainly, in the above-mentioned embodiments, a first adhesive 15 may be further arranged between the photoinduced peelable adhesive 12 and the basic material layer 11 to further increase the adhesive force between the protective film 10 and the circuit board 1. When the display device is assembled, the photoinduced peelable adhesive 12 is irradiated using UV light, which reduces and even loses the adhesiveness of the photoinduced peelable adhesive 12. The first adhesive 15 falls off from the circuit board. Therefore, the first adhesive 15 does not increase the tearing-off force of the protective film, and the conductive adhesive is prevented from being torn off when the protective film is torn off.

In the present embodiment, a light-shielding film 14 may be further arranged on a second surface of the basic material layer 11 facing away from the substrate 100. The orthographic projection of the photoinduced peelable adhesive 12 on a substrate 100 is located within an orthographic projection of the light-shielding film 14 on the substrate 100. The light-shielding film 14 is configured to protect the photoinduced peelable adhesive 12 from being irradiated by the UV light, which prevents the photoinduced peelable adhesive from being irradiated by the UV light before the display device is assembled.

When the light-shielding film 14 is removed, the photoinduced peelable adhesive 12 still has adhesiveness. In order to avoid a damage to the adhesive area between the photoinduced peelable adhesive 12 and the circuit board when the light-shielding film 14 is removed, the adhesiveness of the photoinduced peelable adhesive 12 is set to be larger than that of the light-shielding film 14.

Certainly, the light-shielding film may be omitted if no UV light is guaranteed in the case of production.

Further, a first handle 141 is arranged on at least one side of the light-shielding film 14, so as to tear off the light-shielding film 14 by the first handle 141 when the display device is assembled. The photoinduced peelable adhesive 12 is irradiated by the UV light to lose its adhesiveness.

Further, a second handle 111 is arranged at at least one side of the basic material layer 11, so as to tear off the protective film 10 after the photoinduced peelable adhesive 12 loses adhesiveness.

The first handle 141 and the second handle 111 are located at different sides of the conductive adhesive 3, so as to tear off the light-shielding film 14 before irradiation. That is, the orthographic projection of the second handle 111 on the basic material layer 11 is not overlapped with the first handle 141.

Some embodiments of the present disclosure further provide a method for assembling a display device, where the display device includes an electrostatic discharge structure and the circuit board according to any of the above-mentioned embodiments. The method includes:

irradiating the photoinduced peelable adhesive on the circuit board using the light with a first wavelength to reduce an adhesiveness of the photoinduced peelable adhesive;

removing the protective film; and connecting the electrostatic discharge structure with the conductive pattern of the circuit board electrically through the conductive adhesive.

The electrostatic discharge structure is connected with the conductive pattern of the circuit board electrically by the conductive adhesive, so as to release the static charges on the circuit board by the electrostatic discharge structure.

The display device manufactured by the above-mentioned assembling method ensures that the conductive adhesive is not polluted, the conductive pattern of the circuit board is stably and electrically connected with the electrostatic discharge structure by the conductive adhesive which is not polluted, such that the static charges are discharged, and the quality of the display device is improved.

When the light-shielding film is arranged on the surface of the basic material layer of the protective film facing away from the substrate, and before irradiating the photoinduced peelable adhesive using ultraviolet light, the method includes: removing the light-shielding film.

In the above-mentioned steps, the light-shielding film is removed to expose the photoinduced peelable adhesive, and the photoinduced peelable adhesive is irradiated using the UV light, such that its adhesiveness is reduced or even lost.

Before the protective film is torn off, the light-shielding film may prevent the UV light from irradiating the photoinduced peelable adhesive, the adhesive force between the protective film and the circuit board is increased using the photoinduced peelable adhesive, and it is ensured that the protective film does not fall off.

The display device may be a mobile phone, a navigator, a TV, a computer, an electronic book, etc.

In some optional embodiments, the electrostatic discharge structure is a metal element of the display device which is grounded.

Taking the mobile phone as an example, a middle housing of the mobile phone has a grounded structure, which may be the electrostatic discharge structure. When the mobile phone is assembled, the conductive pattern of the circuit board is electrically connected with the grounded structure on the middle housing by the conductive adhesive, so as to release the static charges on the circuit board by the grounded structure.

The method for assembling the display device according to the embodiments of the present disclosure includes:

adhering the conductive adhesive onto the copper exposure area of the circuit board, where the copper exposure area is a conductive pattern, and is electrically connected to the electrostatic discharge structure of the display device, to release static charges;

tearing off the protective layer of the protective film, and adhering the surface of the protective film with the photoinduced peelable adhesive onto the conductive adhesive, at least the periphery of the conductive adhesive having the photoinduced peelable adhesive;

manufacturing the display module;

removing the light-shielding film, and irradiating the photoinduced peelable adhesive using the UV light, such that the adhesiveness of the photoinduced peelable adhesive is reduced;

removing the protective film; and connecting the electrostatic discharge structure with the conductive pattern of the circuit board electrically by the conductive adhesive, so as to release the static charges on the circuit board by the electrostatic discharge structure.

The above descriptions are merely optional embodiments of the present disclosure. It should be noted that numerous improvements and modifications may be made for a person skilled in the art without departing from the principle of the present disclosure, and these improvements and modifications shall fall within the protection scope of the present disclosure.

What is claimed is:

1. A circuit board; comprising:
    a substrate,
    a conductive pattern on the substrate;
    a conductive adhesive on the conductive pattern;
    a protective film on the conductive adhesive; and
    a light-shielding film on the protective film;
    wherein
    the conductive pattern is configured to, after the protective film and the light-shielding film are removed, be connected to an electrostatic discharge structure to release static charges;
    the protective film comprises a basic material layer, and a photoinduced peelable adhesive arranged on a first surface of the basic material layer, wherein the photoinduced peelable adhesive is located between the basic material layer and the substrate, and has a low adhesive force in the exposure of light with a first wavelength; and the photoinduced peelable adhesive is arranged in a peripheral area of the conductive adhesive, the light-shielding film is arranged on a second surface of the basic material layer facing away from the substrate, wherein an orthographic projection of the photoinduced peelable adhesive onto the substrate is located within an orthographic projection of the light-shielding film onto the substrate, wherein an adhesiveness of the photoinduced peelable adhesive is larger than an adhesiveness of the light-shielding film.

2. The circuit board according to claim 1, wherein an orthographic projection of the conductive adhesive onto the substrate is not overlapped with an orthographic projection of the photoinduced peelable adhesive onto the substrate, and the orthographic projection of the photoinduced peelable adhesive onto the substrate and the orthographic projection of the conductive adhesive onto the substrate are within an orthographic projection of the basic material layer onto the substrate.

3. The circuit board according to claim 1, wherein the photoinduced peelable adhesive comprises a plurality of adhesive sub-patterns that is distributed at intervals and surrounds the conductive adhesive.

4. The circuit board according to claim 1, wherein an orthographic projection of the conductive adhesive onto the substrate is located within an orthographic projection of the photoinduced peelable adhesive onto the substrate.

5. The circuit board according to claim 1, wherein the protective film further comprises a first adhesive arranged between the basic material layer and the photoinduced peelable adhesive.

6. The circuit board according to claim 1, wherein at least one side of the light-shielding film is provided with a first handle.

7. The circuit board according to claim 1, wherein at least one side of the basic material layer is provided with a second handle.

8. The circuit board according to claim 1, wherein the conductive pattern is made of copper.

\* \* \* \* \*